US007598617B2

(12) United States Patent
Lee et al.

(10) Patent No.: US 7,598,617 B2
(45) Date of Patent: Oct. 6, 2009

(54) STACK PACKAGE UTILIZING THROUGH VIAS AND RE-DISTRIBUTION LINES

(75) Inventors: Seung Hyun Lee, Kyoungki-do (KR); Min Suk Suh, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 64 days.

(21) Appl. No.: 11/647,703

(22) Filed: Dec. 29, 2006

(65) Prior Publication Data

US 2007/0222050 A1    Sep. 27, 2007

(30) Foreign Application Priority Data

Mar. 17, 2006    (KR)    ........................ 10-2006-0025054

(51) Int. Cl.
*H01L 23/02* (2006.01)
*H01L 23/48* (2006.01)
*H01L 23/12* (2006.01)
*H01L 25/065* (2006.01)
*H01L 25/07* (2006.01)
*H01L 25/18* (2006.01)

(52) U.S. Cl. .............................. 257/777; 257/E25.013; 257/E23.011; 257/678; 257/734; 257/737; 257/738; 257/778; 257/723; 257/686; 257/685; 257/680; 257/773; 257/774

(58) Field of Classification Search ................. 257/777, 257/723, 734, 678, E25.013, E23.011, 686, 257/685, 737, 738, 774, 775, 776, 680, 778
See application file for complete search history.

(56) References Cited

U.S. PATENT DOCUMENTS

| 6,392,292 | B1 | | 5/2002 | Morishita | |
|---|---|---|---|---|---|
| 6,429,096 | B1 | * | 8/2002 | Yanagida | ..................... 438/459 |
| 6,569,762 | B2 | * | 5/2003 | Kong | ......................... 438/667 |
| 6,693,358 | B2 | * | 2/2004 | Yamada et al. | .............. 257/774 |

(Continued)

FOREIGN PATENT DOCUMENTS

JP    10-223833    8/1998

(Continued)

OTHER PUBLICATIONS

Notice of Preliminary Rejection from Korean Intellectual Property Office.

*Primary Examiner*—Alexander O Williams
(74) *Attorney, Agent, or Firm*—Ladas & Parry LLP

(57)    ABSTRACT

A stack package includes a printed circuit board; at least two semiconductor chips stacked on the printed circuit board, each having first re-distribution lines formed on the upper surface thereof and connected to bonding pads, through silicon vias which are formed therethrough and connected to the first re-distribution lines, and second re-distribution lines formed on the lower surface thereof and connected to the through silicon vias; first and second solder balls interposed between the first and second re-distribution lines which face each other and between the first re-distribution lines of the lowermost semiconductor chip and electrode terminals of the printed circuit board; a molding material for molding the upper surface of the printed circuit board including the stacked semiconductor chips; and third solder balls attached to ball lands formed on the lower surface of the printed circuit board.

9 Claims, 3 Drawing Sheets

U.S. PATENT DOCUMENTS

| | | | |
|---|---|---|---|
| 6,699,787 B2 * | 3/2004 | Mashino et al. | 438/667 |
| 2005/0205968 A1 * | 9/2005 | Kim | 257/621 |
| 2006/0220261 A1 * | 10/2006 | Egawa | 257/778 |
| 2007/0013062 A1 * | 1/2007 | Kobayashi et al. | 257/734 |
| 2007/0045780 A1 * | 3/2007 | Akram et al. | 257/621 |
| 2007/0132104 A1 * | 6/2007 | Farnworth et al. | 257/774 |
| 2007/0158787 A1 * | 7/2007 | Chanchani | 257/619 |
| 2007/0200216 A1 * | 8/2007 | Kim et al. | 257/686 |
| 2007/0259517 A1 * | 11/2007 | Benson et al. | 438/618 |
| 2007/0281374 A1 * | 12/2007 | Lee et al. | 438/14 |
| 2008/0088031 A1 * | 4/2008 | Kwon et al. | 257/777 |
| 2008/0105984 A1 * | 5/2008 | Lee | 257/777 |

FOREIGN PATENT DOCUMENTS

| | | |
|---|---|---|
| JP | 2004-363573 | 12/2004 |
| KR | 19990031914 | 5/1999 |
| KR | 100282003 | 11/2000 |
| KR | 1020030095459 | 12/2003 |
| KR | 1020060133800 | 12/2006 |

\* cited by examiner

STACK PACKAGE UTILIZING THROUGH VIAS AND RE-DISTRIBUTION LINES

CROSS-REFERENCE TO RELATED APPLICATIONS

The present application claims priority to Korean patent application number 10-2006-0025054 filed on Mar. 17, 2006, which is incorporated by reference in its entirety.

BACKGROUND OF THE INVENTION

The present invention relates to a stack package, and more particularly, to a stack package using re-distribution lines and solder balls.

As the performances of electric and electronic products are improved, techniques for mounting an increased number of packages to a substrate having a limited size have been researched. Generally, in a stack package, one semiconductor chip is mounted to a substrate, which increases the difficulty of attaining a desired capacity.

As a method of increasing the capacity of a memory chip, that is, for accomplishing high integration, it is generally known in the art that an increased number of cells are formed in a limited space. However, this method requires use of high-precision process techniques involving a fine design rule and results in a substantially longer development time. Accordingly, a stacking technology has been developed as a method for easily realizing high integration, and research for the stacking technology has been active.

As used in the semiconductor industry, the term "stacking" means to vertically arrange at least two semiconductor chips to increase memory capacity. For example, by stacking two 256M DRAM chips, 512M DRAM can be configured in a single package. In addition, stacking technology provides advantages in mounting density and mounting area utilization efficiency.

With respect to stacking at least two semiconductor chips, a method in which at least two semiconductor chips are stacked in one package, and a method in which at least two packages are stacked, are known in the art.

FIG. 1 is a cross-sectional view illustrating the conventional stack package manufactured by the first method. Referring to FIG. 1, three semiconductor chips 110, 120 and 130, of different sizes that possess bonding pads 112, 122 and 132 on the peripheral portions thereof, are stacked on a printed circuit board (hereinafter referred to as "PCB") 100. The bonding pads 112, 122 and 132 of the respective semiconductor chips 110, 120 and 130 and the circuit patterns 102 of the PCB 100 are connected to each other by metal wires 140. The upper surface of the PCB 100, including the semiconductor chips 110, 120 and 130 and the metal wires 140, is molded by a molding material 150. Solder balls 160, providing electrical connections to external circuits, are attached to the lower surface of the PCB 100.

However, in the conventional stack package resulting from the construction method described above, since the bonding pads 112, 122 and 132 are formed on the peripheral portions of the semiconductor chips 110, 120 and 130 and connected to the circuit patterns 102 of the PCB 100 by the metal wires 140, same-size semiconductor chips cannot be stacked unless a tape containing a shock-absorbing substance is interposed between two adjoining semiconductor chips. Furthermore, because the electrical connections in a conventional stack package are formed by the metal wires 140, it is difficult to apply the stack package in high-speed products. Moreover, the presence of wire loops in the conventional stack package increases the size of the package.

SUMMARY OF THE INVENTION

The embodiments of the present invention are directed to a stack package which can stack same-size semiconductor chips without using a tape containing a shock-absorbing substance.

Further, the embodiments of the present invention are directed to a stack package which can be easily applied to high-speed products.

Moreover, the embodiments of the present invention are directed to a stack package with a decreased overall size.

In one embodiment, a stack package comprises a PCB formed with circuit patterns and having electrode terminals located on the upper surface thereof and ball lands located on the lower surface thereof; at least two semiconductor chips stacked on the PCB in a face-down manner, each having first re-distribution lines formed on the upper surface thereof and connected to the bonding pads, through silicon vias formed therethrough and connected to the first re-distribution lines, and second re-distribution lines formed on the lower surface thereof and connected to the through silicon vias; first solder balls interposed between the first and second re-distribution lines of the stacked semiconductor chips, which face each other, thereby forming electrical and physical connections therebetween; second solder balls interposed between the first re-distribution lines of the lowermost semiconductor chip of the stacked semiconductor chips and the electrode terminals of the printed circuit board, thereby forming electrical and physical connections therebetween; a molding material for molding the upper surface of the printed circuit board including the stacked semiconductor chips; and third solder balls attached to the ball lands on the lower surface of the printed circuit board, serving as mounting means.

The first and second re-distribution lines are formed of copper.

The through silicon vias are formed of copper or nickel/gold.

Each through silicon via includes an insulation layer formed on the interface between the semiconductor chip and the through silicon via.

The stack package further comprises solder resists formed on the upper and lower surfaces of each semiconductor chip, which expose only portions of the first and second re-distribution lines.

The semiconductor chips are the same size, and the first and second re-distribution lines of the semiconductor chips are formed to be of the same size.

The semiconductor chips are different sizes, and the second re-distribution lines of one semiconductor chip are formed to have lengths for allowing the second re-distribution lines to connect to the corresponding first re-distribution lines of the other semiconductor chip.

DESCRIPTION OF SPECIFIC EMBODIMENTS

In the present invention, through silicon vias (hereinafter referred to as "TSVs") and re-distribution lines are formed in respective semiconductor chips to be stacked, and the stack of the aforementioned semiconductor chips is formed by connecting the re-distribution lines to one another.

In the stack package according to the present invention, the TSVs, re-distribution lines and solder balls form the electrical connections between the semiconductor chips, which provide several advantages. First, this allows the stack package to be applied to high-speed products through minimization of the electrical signal transmittance path. Second, not only semiconductor chips of different sizes but also semiconductor chips of the same size can be easily stacked upon one another without interposing a tape containing a shock-absorbing substance between two adjoining semiconductor chips. Third, the overall size of the stack package can be decreased since it is not necessary to consider wire loops.

Figure 2A:
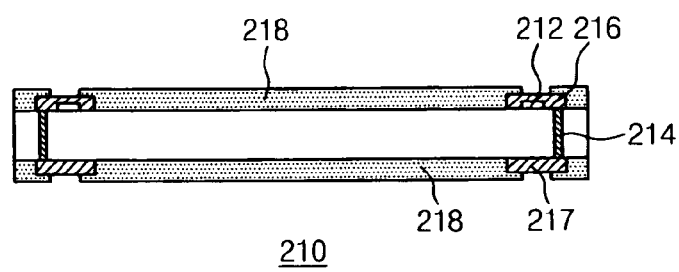
FIGS. 2A and 2B are cross-sectional views illustrating a stack package in accordance with one embodiment of the present invention.
Figure 2B:
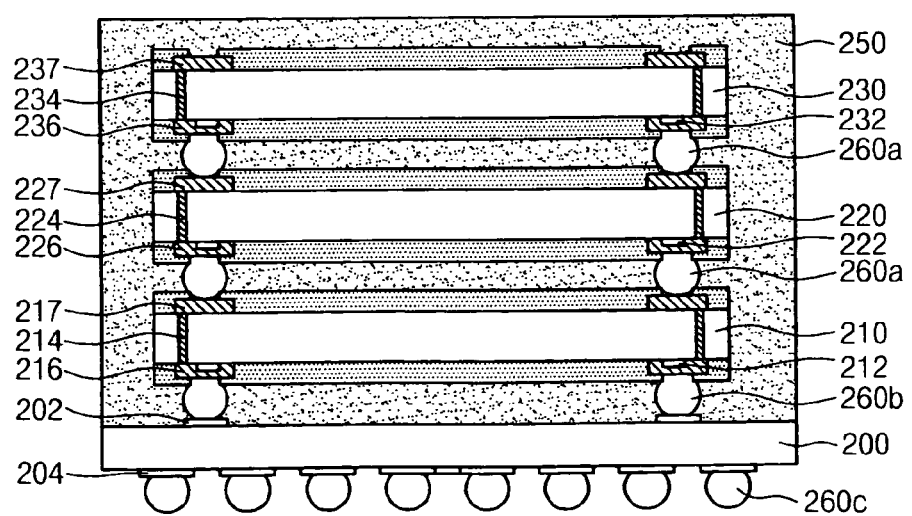

Hereafter, a stack package in accordance with one embodiment of the present invention will be described in detail with reference to FIGS. 2A and 2B. FIG. 2A is a cross-sectional view illustrating a semiconductor chip formed with re-distribution lines and TSVs. FIG. 2B is a cross-sectional view illustrating a stack package in which semiconductor chips formed with re-distribution lines and TSVs are stacked on a printed circuit board (PCB).

Referring to FIG. 2A, a semiconductor chip 210 has bonding pads 212 located on the peripheral portions of the upper surface thereof. Adjacent to the bonding pads 212, TSVs 214 are defined through the semiconductor chip 210. First re-distribution lines 216 and second re-distribution lines 217 are formed on the upper and lower surfaces of the semiconductor chip 210 such that the first re-distribution lines 216 and the second re-distribution lines 217 are respectively connected to the upper and lower ends of the TSVs 214. The first re-distribution lines 216 are connected to the upper ends of the TSVs 214 as well as the bonding pads 212. Solder resists 218 are formed on the upper and lower surfaces of the semiconductor chip 210 including the first re-distribution lines 216 and the second re-distribution lines 217, such that only portions of the first re-distribution lines 216 and the second re-distribution lines 217 are exposed.

The bonding pads 212 are formed on the upper surface of the semiconductor chip 210 irrespective of the sizes and positions of the TSVs 214. Each TSV 214 is formed in a manner such that copper or nickel/gold is filled in a via hole defined through the semiconductor chip 210. In particular, the TSV 214 includes an insulation layer (not shown), which is formed on the interface between the semiconductor chip 210 and the TSV 214, for electrical insulation. The first re-distribution lines 216 and the second re-distribution lines 217 are formed of copper.

Referring to FIG. 2B, a PCB 200 is provided. The PCB 200 is formed with circuit patterns (not shown) and has electrode terminals 202 located on the upper surface thereof and ball lands 204 located on the lower surface thereof. At least two, for example, three semiconductor chips 210, 220 and 230 in FIG. 2B, each having the configuration as described above, are stacked on the PCB 200 in a face-down manner.

Here, the stacked semiconductor chips 210, 220 and 230 are electrically and physically connected to one another by first solder balls 260a, which are interposed between the first re-distribution lines 226 and 236 and the second re-distribution lines 217 and 227 facing each other. The lowermost semiconductor chip 210 of the stacked semiconductor chips 210, 220 and 230 and the PCB 200 are electrically and physically connected to each other by second solder balls 260b which are interposed between the bonding pads 212 and the electrode terminals 202 facing each other.

In order to prevent the semiconductor chips 210, 220 and 230 from being damaged by outer circumstances, the upper surface of the PCB 200 including the stacked semiconductor chips 210, 220 and 230 is molded by a molding material 250. Third solder balls 260c, which serve as mounting means to external circuits, are attached to the ball lands 204 on the lower surface of the PCB 200. In FIG. 2B, the reference numerals 224 and 234 designate TSVs which are respectively formed through the semiconductor chips 220 and 230; the reference numerals 222 and 232 designate the bonding pads which are respectively formed on the semiconductor chips 220 and 230; and the reference numeral 237 designates the second re-distribution lines which are formed on the semiconductor chip 230.

In the stack package according to the present invention, the electrical connections between the semiconductor chips and the electrical connections between the semiconductor chips and the PCB are formed using the TSVs, re-distribution lines, and solder balls rather than metal wires. Therefore, the electrical signal transmittance path can be shortened to the minimum distance according to the present invention, and the stack package can therefore be advantageously applied to high-speed products. Also, in the present invention, because the metal wires are not used, it is not necessary to consider wire loops, and therefore the overall size of the stack package can be decreased.

Figure 3:
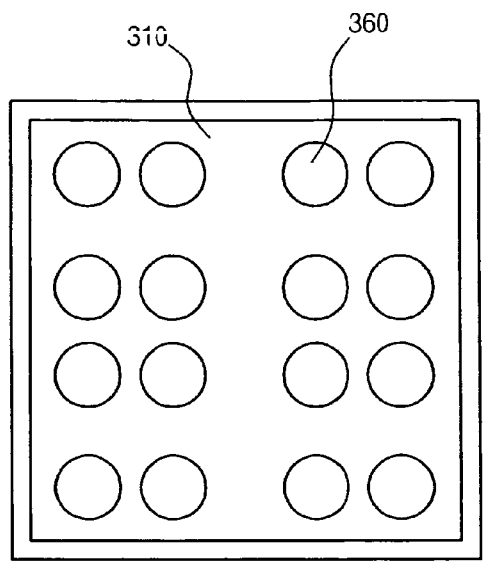
FIG. 3 is a bottom view illustrating the solder ball attachment structure of the stack package in accordance with one embodiment of the present invention.

In addition, in the present invention, as shown in FIG. 3, solder balls 360 can be attached over the entire surface of the semiconductor chip 310 through rearrangement of bonding pads and TSVs. Therefore, semiconductor chips of not only the same size but also different sizes can be easily stacked without using tapes containing a shock-absorbing substance.

Figure 1:
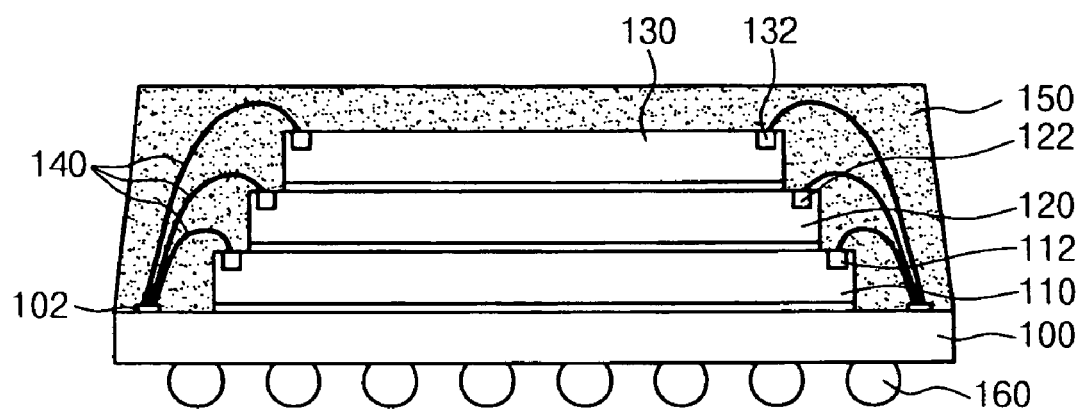
FIG. 1 is a cross-sectional view illustrating a conventional stack package.
Figure 4:
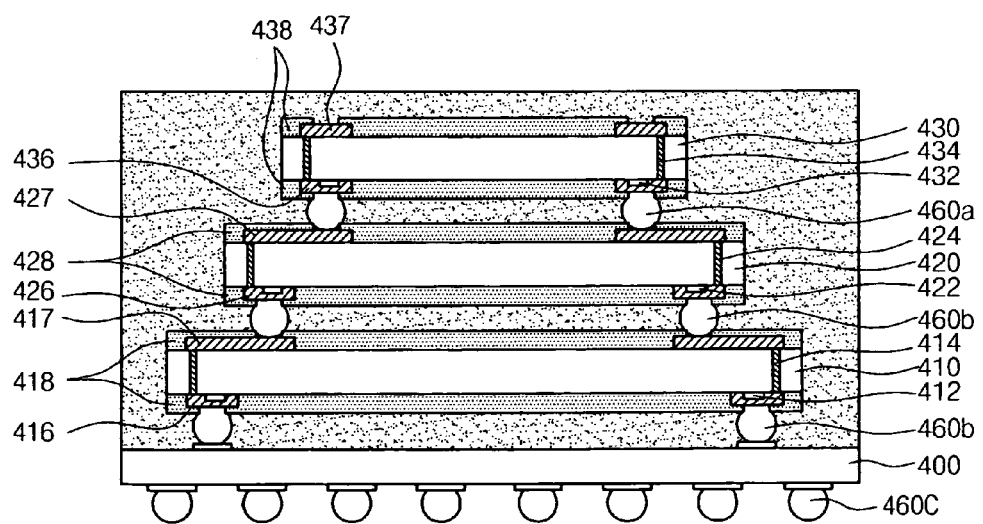
FIG. 4 is a cross-sectional view illustrating a stack package in accordance with another embodiment of the present invention.

FIG. 4 is a cross-sectional view illustrating a stack package in accordance with another embodiment of the present invention. Referring to FIG. 1, in the stack package according to an embodiment, semiconductor chips 410, 420 and 430, each having a different size, are stacked upon one another. This is enabled by the fact that the attachment positions of the first solder balls 460a and second solder balls 460b can be optionally adjusted through rearrangement of the bonding pads 412, 422 and 432 and TSVs 414, 424 and 434. That is to say, in the present embodiment, by adjusting the lengths of the first re-distribution lines 416, 426 and 436 and the second re-distribution lines 417, 427 and 437 and adjusting the exposure positions thereof from the solder resists 418, 428 and 438 in the respective semiconductor chips 410, 420 and 430, the attachment positions of the first solder balls 460a and the second solder balls 460b can be optionally adjusted, whereby the semiconductor chips having different sizes can be easily stacked.

Meanwhile, in the stack package according to one embodiment of the present invention as described above and illustrated in FIG. 2, if the stacked semiconductor chips 210, 220 and 230 are of the same size, the first re-distribution lines 216, 226 and 236 and the second re-distribution lines 217, 227 and 237 of the respective semiconductor chips 210, 220 and 230 are formed to have the same length. In contrast, in the stack package according to another embodiment of the present invention as described above and illustrated in FIG. 4, if the stacked semiconductor chips 410, 420 and 430 are of different sizes, the first re-distribution lines 416, 426 and 436 and the second re-distribution lines 417, 427 and 437 of the respective semiconductor chips 410, 420 and 430 are formed to have different lengths. For example, the second re-distribution lines 417, 427 and 437 of the respective semiconductor chips 410, 420 and 430 are formed to have lengths which allow the second re-distribution lines 417, 427 and 437 to connect to the corresponding first re-distribution lines 426 and 436 of the upwardly located semiconductor chips 420 and 430.

In the stack package, the upper surface of the PCB 400 including the stacked semiconductor chips 410, 420 and 430 is molded by a molding material. In FIG. 4, the reference numeral 460c designates third solder balls.

As is apparent from the above description, the stack package according to various embodiments of the present invention provides advantages in that, since electrical connections between the semiconductor chips and between a semiconductor chip and the PCB are formed through TSVs and re-distribution lines without the use of metal wires, the stack package can be easily applied to high-speed products. Also, in the present invention, because wire loops are not adopted, the overall size of the stack package can be decreased.

Further, because the positions of solder balls can be appropriately adjusted in the present invention, not only semiconductor chips of different sizes but also uniform-size semiconductor chips can be easily stacked without using specific tapes containing a shock-absorbing substance.

Moreover, because solder balls can be attached over the entire surface of the semiconductor chip in the present invention, the stress induced in the semiconductor chip can be dispersed over a large area, whereby it is possible to provide a stack package having improved reliability.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stack package comprising:
a printed circuit board formed with circuit patterns and having electrode terminals located on an upper surface thereof and ball lands located on a lower surface thereof;
at least two semiconductor chips stacked on the printed circuit board in a face-down manner, and each having first re-distribution lines which are formed on an upper surface of the semiconductor chips and connected to bonding pads, through silicon vias which are formed therethrough and connected to the first re-distribution lines, and second re-distribution lines which are formed on a lower surface that is opposite to the upper surface, and connected to the through silicon vias;
wherein the first redistribution lines and the second redistribution lines are formed to have different lengths,
first solder balls interposed between the first and second re-distribution lines of the stacked semiconductor chips, which face each other, to form electrical and physical connections therebetween;
second solder balls interposed between the first re-distribution lines of the lowermost semiconductor chip of the stacked semiconductor chips and the electrode terminals of the printed circuit board, to form electrical and physical connections therebetween;
a molding material for molding the upper surface of the printed circuit board including the stacked semiconductor chips; and
third solder balls attached to the ball lands on the lower surface of the printed circuit board, to serve as mounting means.

2. The stack package of claim 1, wherein the first and second re-distribution lines are formed of copper.

3. The stack package of claim 1, wherein the through silicon vias are formed of copper or nickel/gold.

4. The stack package of claim 1, wherein each through silicon via includes an insulation layer which is formed on an interface between the semiconductor chip and the through silicon via.

5. The stack package of claim 1, further comprising:
solder resists formed on the upper and lower surfaces of each semiconductor chip to expose only portions of the first and second re-distribution lines.

6. The stack package of claim 1, wherein the semiconductor chips have the same size.

7. The stack package of claim 6, wherein the first and second re-distribution lines of the semiconductor chips are formed to have the same size.

8. The stack package of claim 1, wherein the semiconductor chips have different sizes.

9. The stack package of claim 8, wherein the second re-distribution lines of one semiconductor chip are formed to have lengths for allowing the second re-distribution lines to be connected to the corresponding first re-distribution lines of the other semiconductor chip.

* * * * *